US008723136B2

(12) United States Patent
Biberger et al.

(10) Patent No.: US 8,723,136 B2
(45) Date of Patent: May 13, 2014

(54) PARTICLE BEAM SYSTEM AND METHOD FOR OPERATING THE SAME

(71) Applicant: Carl Zeiss Microscopy GmbH, Jena (DE)

(72) Inventors: Josef Biberger, Wildenberg (DE); Ralph Pulwey, Aalen (DE); Volker Wieczorek, Ulm (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/626,736

(22) Filed: Sep. 25, 2012

(65) Prior Publication Data

US 2013/0082188 A1    Apr. 4, 2013

Related U.S. Application Data

(60) Provisional application No. 61/541,154, filed on Sep. 30, 2011.

(30) Foreign Application Priority Data

Sep. 30, 2011 (EP) .................................... 11007980

(51) Int. Cl.
*G21K 5/02* (2006.01)

(52) U.S. Cl.
USPC .................... 250/396 R; 250/397; 250/492.2; 250/492.22; 250/492.23; 250/492.3; 369/100; 369/101; G9B/7.025; G9B/20.009

(58) Field of Classification Search
USPC .......... 250/396 R, 397, 492.1, 492.2, 492.22, 250/492.23, 492.3; 369/100, 101; G9B/9.025, 20.009
See application file for complete search history.

(56) References Cited

U.S. PATENT DOCUMENTS

| 3,922,546 | A | 11/1975 | Livesay |
| 6,399,954 | B1 * | 6/2002 | Seto et al. ................. 250/492.22 |
| 6,646,275 | B2 * | 11/2003 | Oae et al. ................... 250/492.2 |
| 6,777,697 | B2 * | 8/2004 | Yui et al. .................. 250/492.22 |
| 7,569,841 | B2 | 8/2009 | Hill et al. |
| 2002/0066863 | A1 * | 6/2002 | Chao et al. .................... 250/397 |
| 2009/0084990 | A1 * | 4/2009 | Nishimura et al. ....... 250/492.22 |
| 2011/0182161 | A1 * | 7/2011 | Suzuki et al. .............. 369/47.13 |

FOREIGN PATENT DOCUMENTS

EP        1 722 398 B1    11/2009

OTHER PUBLICATIONS

Extended European Search Report in European patent application No. 11 007 980.3 dated Feb. 28, 2012.

* cited by examiner

*Primary Examiner* — Michael Logie
(74) *Attorney, Agent, or Firm* — Fish & Richardson P.C.

(57) ABSTRACT

A method of operating a particle beam system includes determining a deflection amount and a deflection time of a beam deflection module connected to a data network. The method also includes determining an un-blank time of a beam blanking module connected to the data network, and determining a blank time of the beam blanking module connected to the data network. The method further includes generating a data structure which includes plural data records, wherein each data record includes a command representing an instruction for at least one of the modules, and a command time representing a time at which the instruction is to be sent to the data network. In addition, the method includes sorting the records of the data structure by command time, and generating a set of digital commands based on the data structure. Moreover, the method includes sending the digital commands of the set to the network in an order corresponding to an order of the sorted records.

16 Claims, 6 Drawing Sheets

PARTICLE BEAM SYSTEM AND METHOD FOR OPERATING THE SAME

CROSS-REFERENCE TO RELATED APPLICATIONS

The present application claims priority under 35 U.S.C. §119(e)(1) to U.S. Ser. No. 61/541,154, filed on Sep. 30, 2011. The present application also claims priority under 35 U.S.C. §119 to European patent application serial number 11 007 980.3, filed on Sep. 30, 2011. These contents of these applications are hereby incorporated by reference in their entirety.

FIELD

The disclosure relates to charged particle beam systems and methods of operating charged particle beam systems. The disclosure particularly relates to performing line scans using a charged particle system.

BACKGROUND

Conventional charged particle beam systems typically include a beam source and a focusing lens to direct the charged particle beam onto an object, a beam blanker to blank and un-blank the beam and a beam deflector to scan the beam across the object. Charged particle beam systems may further include a detector to detect charged particles and/or radiation emerging from the object due to the incident beam. Using the detector, images of the object can be generated by scanning the beam across the object and associating detected particle intensities with corresponding scan locations. Scanning of the beam across the object typically includes performing a plurality of line scans, wherein the location of incidence of the beam on the object is continuously moved along straight paths. A line scan is typically initiated by a trigger signal. Other desired actions, such as starting the scan deflection, ending the scan deflection, un-blanking the beam, blanking the beam, starting data acquisition and stopping data acquisition, are electronically controlled relative to the trigger signal by providing adjustable delay circuits in the respective electronic circuits controlling the beam deflector, the beam blanker and the data acquisition, respectively. Other charged particle systems can be used, for example for writing patterns on the object by deflecting the beam to a location within a pattern feature to be written, un-blanking the beam and further deflecting the beam such that it is incident on other locations within the pattern feature.

SUMMARY

The disclosure is based, in part, at least, on the realization that adjusting multiple electronic delay circuits for performing various operations can be tedious, lacking in reproducibility and inflexible.

According to embodiments of the present disclosure, a method of operating a particle beam system includes digitally controlling a first digitally controlled module of the particle beam system and a second digitally controlled module of the particle beam system, sending digital command data to the first and second digitally controlled modules, wherein the digital command data includes at least a first command for the first digitally controlled module and a second command for the second digitally controlled module, wherein the digital command data is generated based on information representing a time when the first command is to be executed by the first digitally controlled module and on information representing a time when the second command is to be executed by the second digitally controlled module. The first and second digitally controlled modules can, in particular, be any of a beam deflector and a beam blanker, a first and second beam deflectors, a beam deflector and a signal detector, and a beam blanker and a signal detector.

According to some embodiments, a method of operating a charged particle beam system includes determining at least one deflection amount and at least one deflection time, generating a first digital command representing an instruction for a beam deflection module of the particle beam system connected to a data network of the particle beam system to provide the at least one deflection to a charged particle beam corresponding to the deflection amount, and sending the digital command to the data network such that the beam deflection module can receive the digital command data in order to perform the instructed operations, i.e. to provide the deflection corresponding to the deflection amount at the deflection time.

The method may further include determining a beam un-blank time and a beam blank time, generating second digital command data instructing a beam blanking module of the charged particle system and connected to the data network to un-blank the charged particle beam at the beam un-blank time and to blank the charged particle beam at the beam blank time and sending the second digital command data to the data network such that the beam blanking module can receive the digital command data in order to perform the instructed operations.

According to particular embodiments, the method may further include generating a data structure including plural data records, wherein each data record includes a command representing an instruction for at least one of the beam deflection module and the beam blanking module, and a command time representing a time at which the instruction is to be sent to the data network; sorting the records of the data structure by command time; and sending a set of digital commands encoding the commands included in the data records to the network in an order corresponding to an order of the sorted records.

According to some embodiments, the method includes determining first and second deflection amounts and first and second deflection times. For example the first and second deflection amounts and times may be used to instruct a line scan, starting at the first deflection time with the first deflection amount and ending at the second deflection time with the second deflection amount, wherein the deflection is changed continuously or in discrete steps during the time period between the first deflection time and the second deflection time.

According to particular embodiments herein, at least one digital command of the set represents a combined instruction for the beam deflection module to provide a deflection to the beam corresponding to the first deflection amount and to subsequently provide a deflection to the beam corresponding to the second deflection amount. The at least one digital command may include, for example, at least one data element representing a time difference between the second deflection time and the first deflection time. Also, the at least one digital command may include at least one data element representing at least one of a deflection step size by which the first beam deflection module is to change the deflection of the beam in subsequent time steps, and a number of steps in which the first beam deflection module is to change the deflection of the beam between the first deflection time and the second deflection time.

According to further embodiments, the method further includes determining a data acquisition start time and a data acquisition stop time, generating digital commands instructing a data acquisition module of the charged particle system and connected to the data network to start collecting data representing detected particle intensities at the acquisition start time and to stop collecting digital signals representing the detected particle intensities at the acquisition stop time and sending these digital commands to the data network such that the data acquisition module can receive the digital command data in order to perform the instructed operations. One or more data records of the sorted data structure may then include a command representing a corresponding instruction for the data acquisition module.

The data network is, within the present disclosure, a communication device supporting transfer of digital data between modules connected to the communication device. The network can be configured to have a particular topology, such as, for example, point-to-point, bus, star and ring.

According to certain embodiments, the set of digital command data is generated such that at least one digital command of the set represents both an instruction for the beam deflection module to provide the deflection to the beam corresponding to the deflection amount and an instruction for the beam blanking module to un-blank the beam. In exemplary embodiments herein, plural digital commands instructing different modules to change their state, such as the beam deflection module to change the provided deflection or the beam blanking module to change from blanking the beam to un-blanking the beam, may also contain instructions for other modules to maintain their state. These latter instructions have no effect on the other modules, but allow for a uniform format of the digital commands and easy distribution to the modules connected to the network in a broadcast type protocol.

Individual digital command data sent across the network can be sent as one packet, or they can be split to fit into plural packages. Irrespective of whether individual command data are split into plural packages or not, they can be represented as a buffer or a set of plural bits representing one or more data elements. In an individual digital command data buffer, at least one data element identifies a command to be performed by the addressed module connected to the network. For example, the data element may represent the command "un-blank the beam" or "blank the beam" for execution by the beam blanker, or "start scan" or "stop scan" for execution by the beam deflector. The digital command data may further include one or more data elements representing command parameters providing additional information for execution of a particular command. For example, the command "start scan" may be accompanied by one or more parameters representing a duration of the scan or a number of scanning steps and a time duration for which the beam should remain at a same scan position during the scan.

According to embodiments, the present disclosure provides a particle beam system including at least a first digitally controlled module, a second digitally controlled module, and an encoding module configured generate digital command data, wherein the digital command data includes at least a first command for the first digitally controlled module and a second command for the second digitally controlled module, wherein the digital command data is generated based on information representing a time when the first command is to be executed by the first digitally controlled module and on information representing a time when the second command is to be executed by the second digitally controlled module. The first and second digitally controlled modules can, in particular, be any of a beam deflector and a beam blanker, a first and second beam deflectors, a beam deflector and a signal detector, and a beam blanker and a signal detector.

According to an exemplary embodiment, a particle beam system includes a charged particle beam source configured to generate a charged particle beam; a data network; a beam blanking module connected to the data network and configured to blank and un-blank the charged particle beam; a focusing lens configured to focus the charged particle beam onto an object; a beam deflection module connected to the data network and configured to deflect the beam; a calculation module configured to determine a deflection time, a beam un-blank time and a beam blank time, to generate a data structure including plural data records, wherein each data record includes a command representing an instruction for one of the beam deflection module and the beam blanking module, and a command time representing a time at which the instruction is to be sent to the data network, and to sort the data records of the data structure by command time; and an encoding module configured to generate a set of digital commands encoding the commands included in the data records and sending the generated digital commands to the network in an order corresponding to an order of the sorted records.

BRIEF DESCRIPTION OF THE DRAWINGS

The foregoing disclosure as well as other advantageous features will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
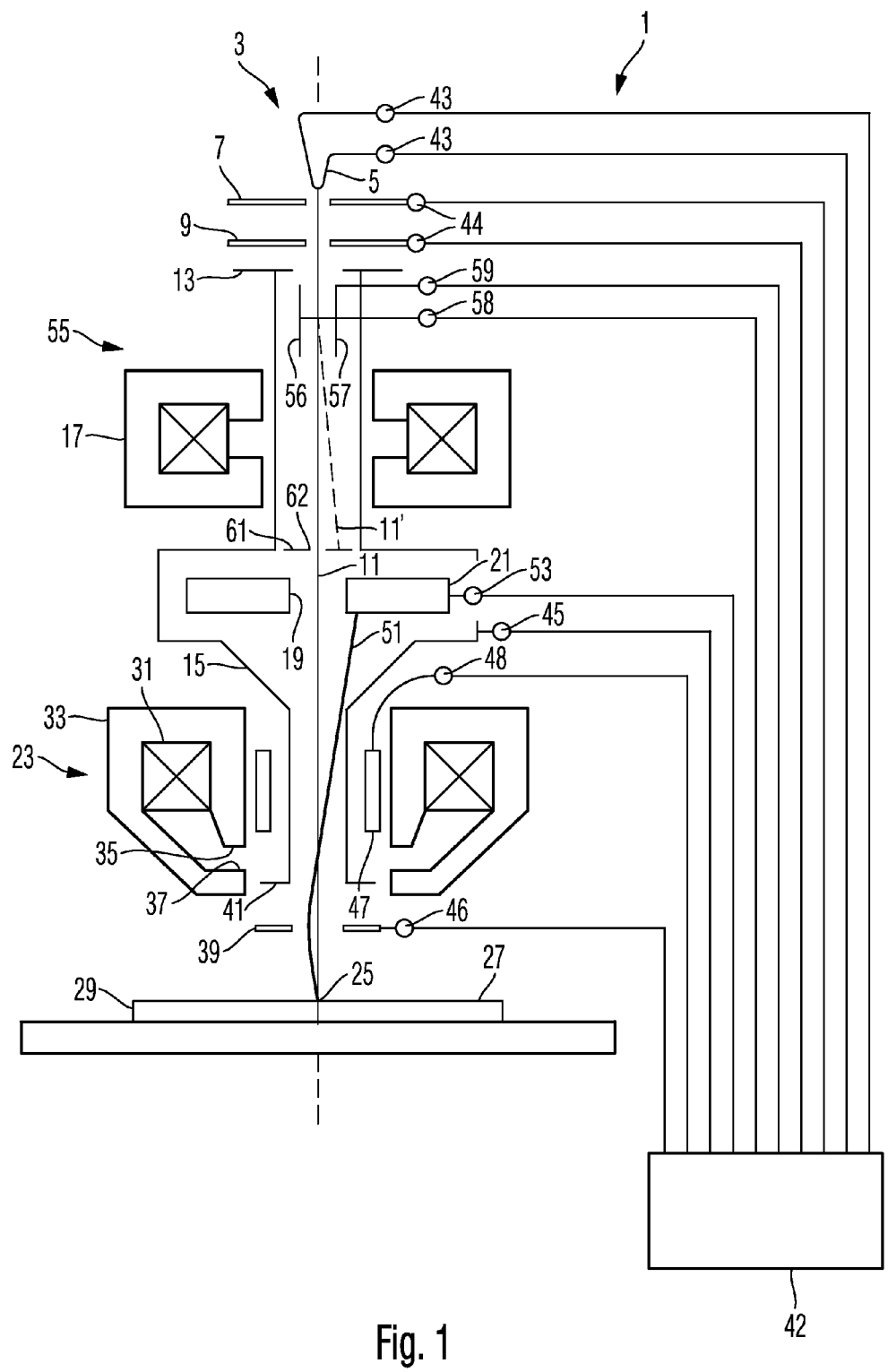
FIG. 1 is a schematic illustration of a charged particle beam system according to an exemplary embodiment.

In the exemplary embodiments described below, components that are alike in function and structure are generally designated by alike reference numerals. Therefore, to understand the features of the individual components of a specific embodiment, the descriptions of other embodiments and the summary may be referred to.

FIG. 1 is a schematic illustration of an embodiment of a particle beam system, which is an electron microscope in the illustrated example. The particle beam system 1 includes a particle beam source 3 including a cathode 5, a suppressor electrode 7 and an extractor electrode 9 for generating an electron beam 11. The electron beam 11 emerging from an opening in the extractor electrode 9 is accelerated by an anode 13 to a predetermined kinetic energy and enters a beam tube 15 via an opening in the anode 13.

The electron beam may traverse a condenser lens 17, an aperture 19 provided in an electron detector 21. The electron beam further traverses an objective lens 23 for focusing the electron beam 11 at a location 25 in an object plane 27 of the objective lens 23. A surface of an object 29 which is to be inspected or manipulated with the particle beam system 1 can be arranged in the object plane 27. The objective lens 23 includes an annular coil 31, which is arranged in an annular pole piece 33, which includes an annular upper pole piece 35 and an annular lower pole piece 37 such that a magnetic field focusing the electron beam 11 is generated in an annular gap between the two pole pieces 35 and 37. The objective lens further includes a terminal electrode 39 which is arranged spaced apart from a lower end 41 of the beam tube 15 and has an opening traversed by the electron beam 11. An electric field generated between the lower end of the beam tube 41 and the terminal electrode 39 decelerates the electrons, propagating inside the beam tube 15 at a high kinetic energy, to a desired lower kinetic energy at which they are incident on the object 29. This electric field may provide an additional focusing effect together with the magnetic field.

The individual components of the particle beam system 1 are controlled by a controller 42. The controller is shown in FIG. 1 as a functional block and includes plural control modules which can be spatially separated from each other or arranged together in, for example, a housing. Also, one or more of the plural control modules can be embodied as individual electric circuits, and/or they can be embodied as software modules running on a suitable processor, such as a general purpose processor, together with other control modules or modules performing other tasks, such as providing a user interface to the system 1.

One module of the controller 42 controls the beam source via connectors 43 for supplying a heating current to the cathode 5 and defining a potential of the cathode. Electric potentials of the suppressor electrode 7 and the extractor electrode 9 are controlled via connectors 44. An electric potential of the beam tube 15 and the anode 13 is defined by the controller via a connector 45. For this purpose, the controller 42 includes a stabilized high voltage source, which supplies a voltage of, for example, 8 kV with respect to ground to the connector 45.

Beam deflectors 47 which are controlled by a beam deflection module of the controller 42 via connectors 48 can be arranged in the objective lens 23. The beam deflectors can be magnetic beam deflectors which may provide adjustable deflecting magnetic fields within the beam tube 15 in order to vary the location 25 at which the electron beam 11 is incident on the object 29, and to scan the particle beam 11 across a portion of the surface 27 of the object 29.

The particle beam 11 incident on the object 29 causes secondary electrons or backscattered electrons to emanate from the object 29. A portion of these electrons may enter the beam tube 15 and can be detected by the electron detector 21.

An exemplary trajectory of a secondary electron incident on the electron detector 21 is labeled with reference numeral 51 in FIG. 1. Detection signals triggered by incident electrons are output by the electron detector 21 at a connector 53 and can be read in by a data acquisition module of the controller 42.

The particle beam source 3 is preferably operated in a stationary mode, i.e. once it is put into operation, the particle beam source 3 is operated for several hours or even days under constant conditions such that the electron beam 11 is continuously generated. However, it is desirable to not allow the electron beam 11 to be constantly incident on the object 29 and to be able to switch the beam on and off as desired. For this purpose the particle beam system 1 includes a beam blanker system 55 which includes a pair of deflector electrodes 56, 57 which can be arranged inside the beam tube 15 such that the electron beam 11 traverses a gap formed between the deflector electrodes 56, 57. The controller 42 includes beam blanking module which supplies electric potentials to the deflector electrodes 56, 57 via connectors 58 and 59.

If both deflector electrodes 56, 57 are at the same electric potential, the beam 11 traverses the gap between the deflector electrodes along a straight line. Preferably, the deflector electrodes are at a same electric potential as the beam tube 15.

If the deflector electrodes 56, 57 are at different electric potentials, an electrostatic field is produced between the two deflector electrodes. This electric field deflects the electron beam 11 away from its original trajectory. The deflected electron beam is shown in FIG. 1 as a broken line 11' and is incident on a plate 61 arranged in the beam tube 15. The plate 61 has an aperture 62 which is traversed by the non-deflected beam 11 to be incident on the surface 27 of the object 29. The electron beam 11' incident on the plate 61 is absorbed and cannot reach the surface 27 of the object 29.

Figure 2:
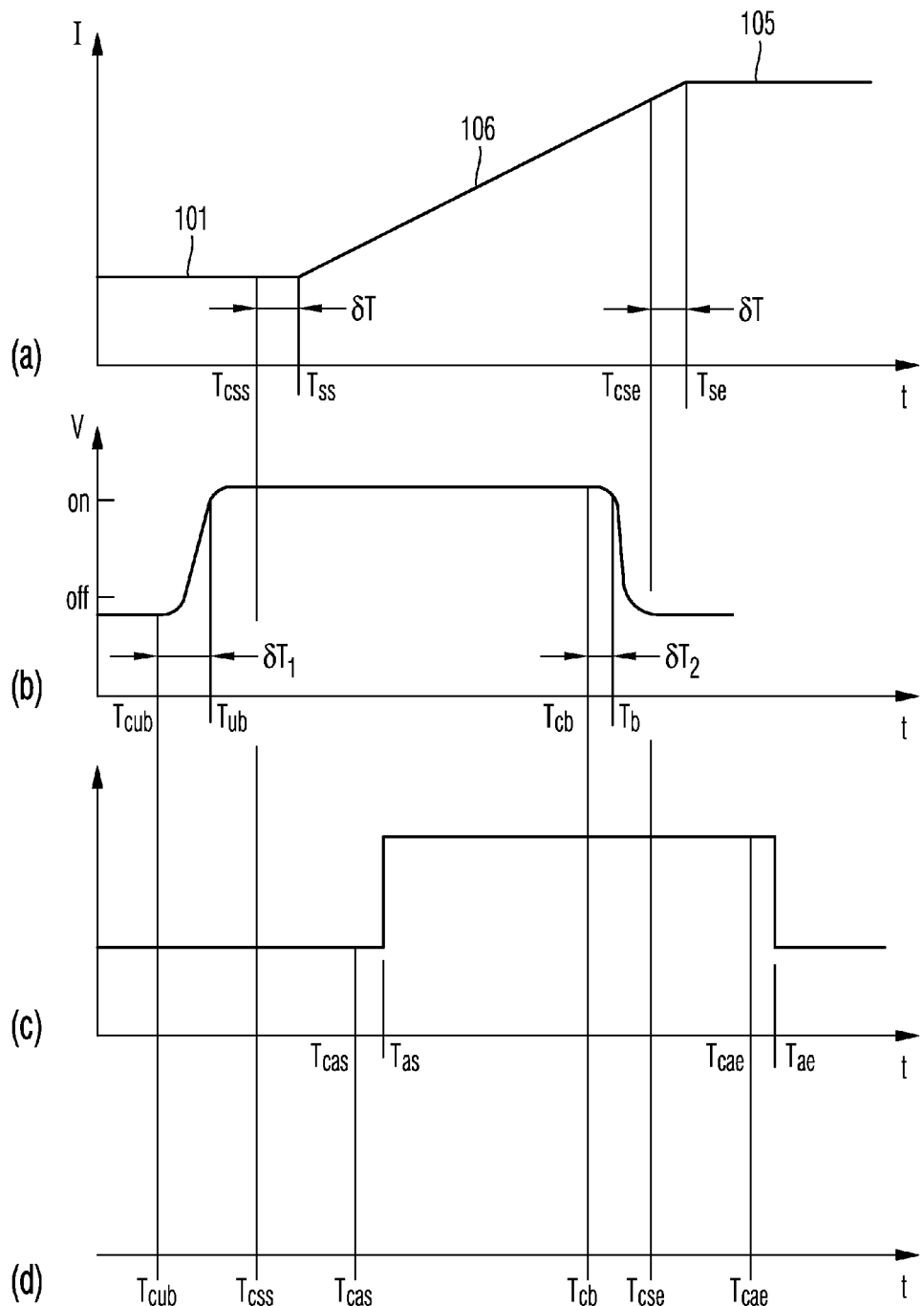
FIG. 2 is a chart illustrating a time sequence of operations of control modules of the system shown in FIG. 1 to perform a line scan.

FIG. 2 shows charts illustrating a time sequence of actions performed by the beam deflection module, the beam blanking module and the data acquisition module of the controller 42. These actions are performed within a procedure to record an image using the electron microscope shown in FIG. 1. Recording an image involves recording plural lines of image information by scanning the beam along lines and recording corresponding detected particle intensities. The particular actions illustrated in FIG. 2 are related to performing one such line scan.

Chart (a) represents a current I supplied to the beam deflectors in dependence of time. This current is at a constant first level 101 in order to provide a deflection corresponding to a first deflection amount in the beginning. The beam scanning starts at a time Tss and stops at a time Tse, such that the current is at a different constant second level 105 in order to provide a deflection corresponding to a second deflection amount after time Tse. Between times Tss and Tse, a continuous increase of the current level occurs, as indicated by reference numeral 106, in order to continuously change the provided deflection such that a line scan is performed in the time period between times Tss and Tse. The currents according to lines 101, 106 and 105 are generated by the beam deflection modules upon receipt of corresponding commands. A command to start the scanning is sent to the network and received by the beam deflection module at a time Tcss before time Tss. A time difference $\delta T$ which is the difference between time Tss and Tcss corresponds to an internal processing time of the beam deflection module. This processing time $\delta T$ is predetermined and known, such that the time Tcss can be suitably selected such that the physical beginning of the beam deflection occurs at time Tss. Similarly, a command to stop the scanning is sent to the network and received by the beam deflection module at a time Tcse. Again, time Tcse is earlier than time Tse, wherein a time difference $\delta T$ between time Tse and time Tcse, accounts for a processing time for the beam deflection module to stop scanning. This processing time $\delta T$ subsequent to Tcse may have a same duration or a different duration than the processing time $\delta T$ subsequent to Tcss.

Chart (b) illustrates a time dependency of a voltage applied to the electrodes 56, 57 of the beam blanker. In this example, the un-blanking of the beam occurs at a time Tub, and the blanking of the beam occurs at a time Tb. Since the beam blank module needs some time to execute received commands and to change the voltages applied to the electrodes, corresponding commands are sent to the network and received by the beam blanking module at earlier command times Tcub and Tcb, respectively. Herein, a time difference $\delta T1$ between Tub and Tcub can be longer than the time difference $\delta T2$ between Tb and Tcb. Blanking the beam involves deflecting the beam traversing the aperture 62 by a small amount such that it is incident on the plate 61. This can be quite fast since the beam is un-blanked even before the deflection of the beam provided by the deflector 56,57 has settled to a stable value. On the other hand, un-blanking the beam involves directing the beam, which is initially incident on the plate 61, such that it exactly traverses the aperture 62 after the deflection of the beam provided by the deflector 56,57 has settled to a stable value. This may involve relatively more time. Exemplary values for $\delta T1$ and $\delta T2$ can be within a range, for example, from 50 ns to 300 ns. In particular, $\delta T1$ and $\delta T2$ can have different values. For example, $\delta T1$ can be longer than $\delta T2$.

According to some embodiments, the time difference between the blank time and the un-blank time differs from the time difference between the second command time and the first command time by more than 50 ns, more than 100 ns or more than 200 ns.

The time Tub at which the beam is un-blanked is, in the illustrated example, earlier than the time Tss at which the beam deflection module starts the scan. This is due to a time for the particles to travel between the electrodes 56, 57 of the beam blanker and the deflection coils 47 of the beam deflector. Due to this traveling time, the beam blanker is operated earlier than the beam deflector. Similarly, the time Tb at which the beam blanker blanks the beam, is earlier than the time Tse at which the beam deflection module stops scanning the beam.

Chart (c) illustrates an operation of the data acquisition module of the controller 42. The detector 21 continuously produces analog detection signals irrespective of whether the beam is blanked or un-blanked or scanned. To record an electron microscopic image of an object, detected particle intensities are associated with scanning locations of the beam at the time of recording, i.e. with locations of the object. For this purpose, it is desired to collect a sequence of data values representing detected particle intensities, wherein the sequence starts when the scanning beam is at a corresponding starting position, corresponding to, for example, a left image margin, and the sequence stops when the scanning beam is at a different position corresponding, for example, to a right image margin. The starting and stopping of the data acquisition is synchronized with the scanning of the beam, wherein the data acquisition is delayed relative to the beam deflection due to times for the primary particles to travel from the deflector to the object and the secondary particles to travel from the object to the detector. As shown in chart (c) the data acquisition module starts collecting the digital image data at a time Tas which is later than the time Tss at which the beam deflection module starts scanning. Similarly, the data acquisition module stops data acquisition at a time Tae which is later than time Tse at which the beam deflection module stops scanning. Again, since the data acquisition module involves some processing time for executing commands, a command for instructing the data acquisition module to start collecting data is sent to the network and received by the data acquisition module at a time Tcas which is earlier than Tas, and a command for instructing the data acquisition module to stop collecting data is sent to the network and received by the data acquisition module at a time Tcae which is earlier than Tae.

Chart (d) illustrates the time sequence of the commands illustrated above for the present exemplary embodiment: Tcub<Tcss<Tcas<Tcb<Tcse<Tcae.

According to other embodiments, other time sequences are possible, depending on, for example, traveling times of particles in the system and processing times of the individual modules.

Figure 3:
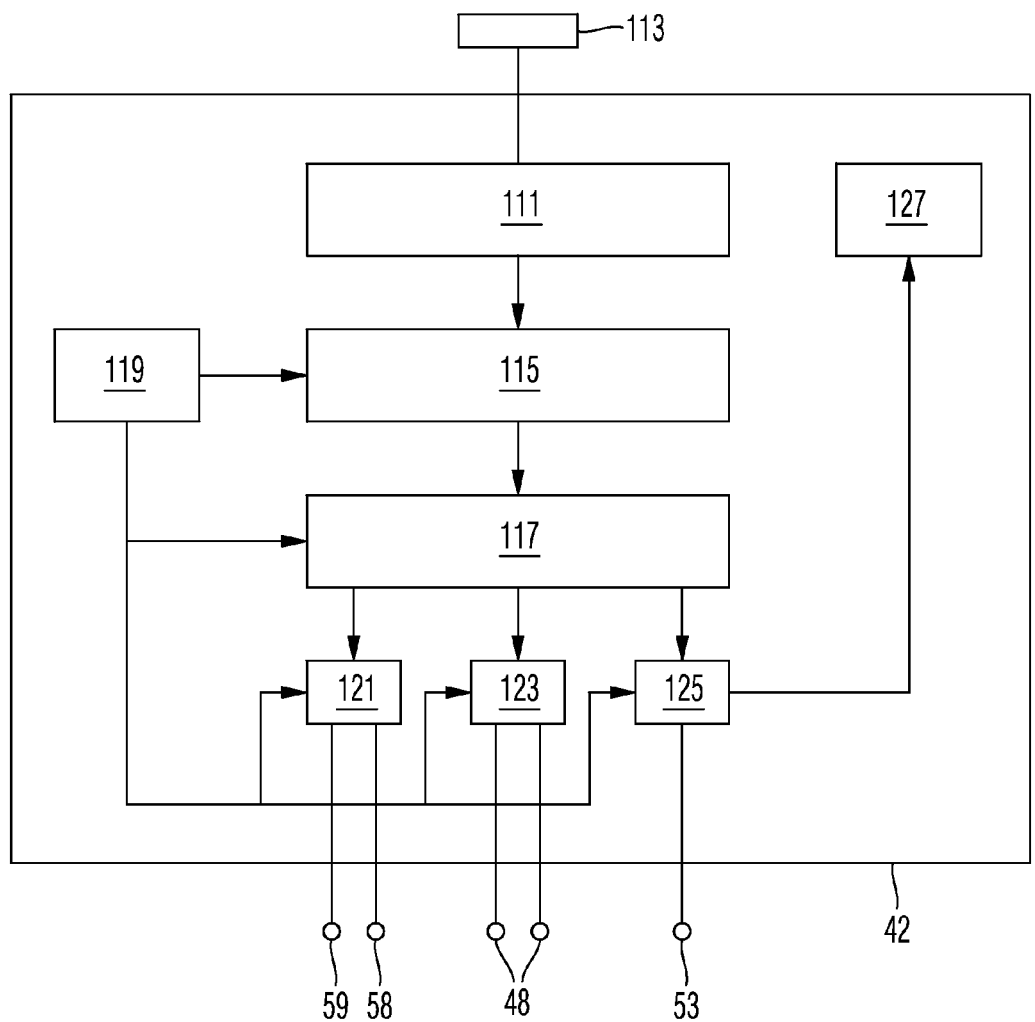
FIG. 3 is a schematic illustration of control modules involved in performing an operation of the system shown in FIG. 1.

FIG. 3 is a schematic illustration of a portion of the controller 42 used for controlling the beam blanker, beam deflector and data acquisition. For this purpose, the controller 42 includes a calculation module 111 which determines the times Tub, Tss, Tas, Tb, Tse, Tae based on plural parameters. Some parameters are received via an interface 113, which can be an interface to a local area network or a keyboard configured to receive data representing the task to be performed, such as left and right boundaries of an image to be recorded, a pixel speed, an image resolution and other parameters. The calculation performed by the module 111 may take a considerable amount of processing time and takes into account other parameters representing physical properties of the charged particle beam system, such as a kinetic energy and a speed of the charged particles in order to calculate corresponding traveling times, and other parameters.

As soon as the module 111 has completed the calculation of the times Tub, Tss, Tas, Tb, Tse, Tae, the corresponding earlier command times Tcub, Tcss, Tcas, Tcb, Tcse, Tcae are calculated based on the processing times used by the respective modules executing the commands. Data representing the Tcub, Tcss, Tcas, Tcb, Tcse, Tcae and additional command parameters are transmitted to a command generation module 115 which encodes the commands and additional parameters into digital command data suitable to be sent to the corresponding modules across a network 117. The module 115 also supplies the generated command data to the network 117 according to the time sequence illustrated in chart (d) of FIG. 2. For this purpose, the module 115 receives a clock signal from a clock 119. The same clock signal is also supplied to components of the network 117 and a beam blanking module 121 to which the electrodes 56, 57 of the beam blanker are connected, a beam deflection module 123, to which the beam deflector 47 is connected, and a data acquisition module 125, to which the detector 21 is connected. The data collected by the data acquisition module 125 are supplied to an image memory 127.

The beam blanking module 121, the beam deflection module 123 and the data acquisition module 125 are connected to the network 117 such that they can receive the commands supplied by the module 115. The modules 121, 123, 125 are configured to execute corresponding actions upon receipt of the commands from the network 117. In the present illustration, it is assumed, that the time between sending a command to the network and the reception of the command by the respective module is negligible. However, if this assumption is not sufficiently accurate in practice, a time for the commands to travel across the network can be taken into account when the times Tcub, Tcss, Tcas, Tcb, Tcse, Tcae are calculated based on the times Tub, Tss, Tas, Tb, Tse, Tae.

Figure 4A:
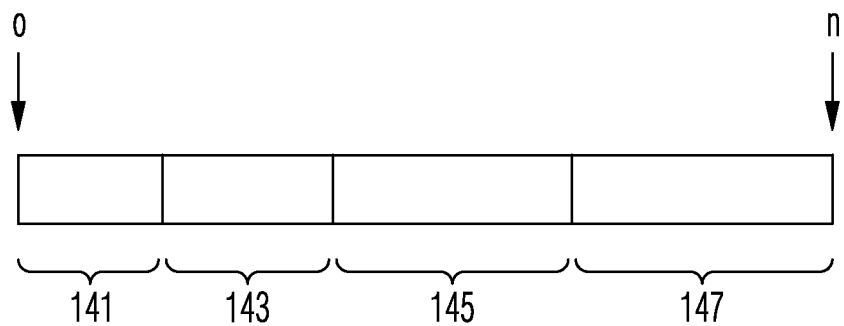
FIGS. 4a and 4b are schematic representations of command data used for communication between control modules shown in FIG. 3.

FIG. 4a schematically shows an exemplary layout of data elements within a data buffer encoding an exemplary command. The data buffer includes a number of n bits with low order bits located on the left in FIG. 4a and high order bits located to the right in FIG. 4a. A first number of consecutive bits 141 represents an address within the network of the destination module of the command. Depending on a topology of the network, such address can be omitted. For example, a network having point-to-point topology, would not require that an address of the addressed module is included in the command.

A second number of consecutive bits 143 represents the command. In the illustrated example, the command is "begin scanning" instructing the beam deflection module to start scanning.

A third number of consecutive bits 145 form a data element representing a command parameter. In the illustrated example, this command parameter is the duration of the scan and instructs the beam deflection module to stop scanning after this duration. As a consequence a separate subsequent command separately instructing the beam deflection module to stop scanning is not necessary. The two commands instructing the beam deflection module to start scanning and instructing the beam deflection module to stop scanning are combined into a single combined command, accordingly. According to other examples, such combined commands are not used, and separate commands are generated starting and stopping the scanning, wherein a data element representing the duration of the scan need not to be included in the command data.

A fourth number of consecutive bits 147 form a data element representing a further command parameter which is a number of scanning steps to be performed between start of the scan and end of the scan. Thus, this parameter determines the image resolution to be achieved with the scan.

Figure 4B:
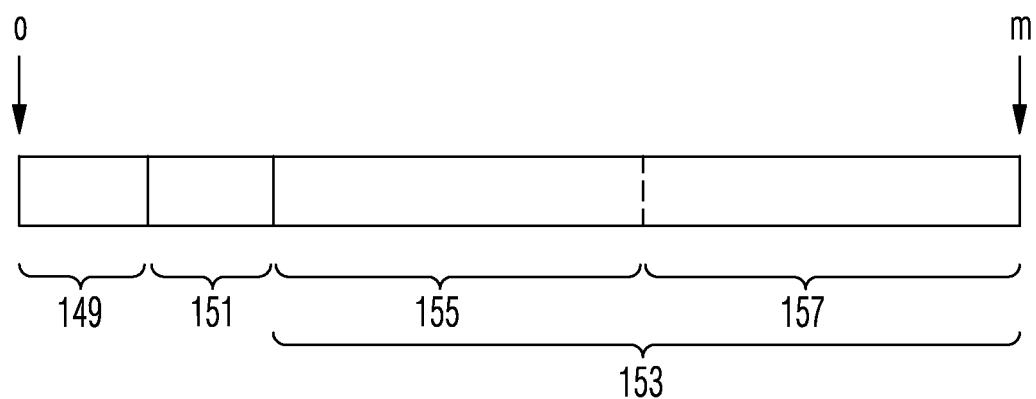

FIG. 4b schematically shows another exemplary layout of data elements within a data buffer encoding plural commands. The data buffer includes a number of m bits with low order bits located on the left in FIG. 4b and high order bits located to the right in FIG. 4b.

A first number of consecutive bits 149 represents the command for the beam blanking module to either blank or un-blank the beam. For example, this command can be encoded by one single bit.

A second number of consecutive bits 151 represents the command for the data acquisition module to either collect data or to not collect data. Also this command can be encoded by one single bit.

A third number of consecutive bits 153 represents the command for the beam deflection module to provide a deflection to the beam corresponding to a given deflection amount. The deflection amount can be encoded, for example, by two sub-groups 155 and 157 of consecutive bits within the third number of consecutive bits 153, wherein sub-group 155 encodes the deflection in an x-direction and sub-group 155 encodes the deflection in an y-direction of the deflection module.

The data buffer can be broadcasted simultaneously to all modules, i.e. the beam deflection module, the beam blanking module and the data acquisition module, wherein the beam blanking module extracts bits 149 from the data buffer and process these bits as a received command, the data acquisition module extracts bits 151 from the data buffer and process these bits as a received command, and the beam blanking deflection module extracts bits 153 from the data buffer and process these bits as a received command.

If, with such layout, the state of only one module has to be changed by a command, it is sufficient to generate the command for this module based on the desired change, and it is easy to generate the commands for the other modules such that they are identical to previous commands to those modules or to the current states of these modules. If, for example, a first command includes an instruction for a beam blanking module to un-blank the beam and a subsequent command includes an instruction for a beam deflection module to start a line scan while the state of the beam blanking module should remain un-changed, i.e. un-blanked, the subsequent command may contain a repeated instruction to un-blank the beam, since such repeated instruction will not change the current state of the beam blanker. If, according to another example, a first command includes an instruction for a beam deflection module to start a line scan and a subsequent command includes an instruction for a beam blanking module to un-blank the beam while the state of the beam deflection module should remain un-changed, i.e. the beam deflector should continue with the line scan, the subsequent command may contain a new instruction for the beam deflection module to start a line scan, wherein the parameters of the new line scan are selected such that the new line scan steadily continues the previous line scan without interruption.

It is apparent that many variations of the command data layout illustrated in FIGS. 4a and 4b are possible.

Figure 5:
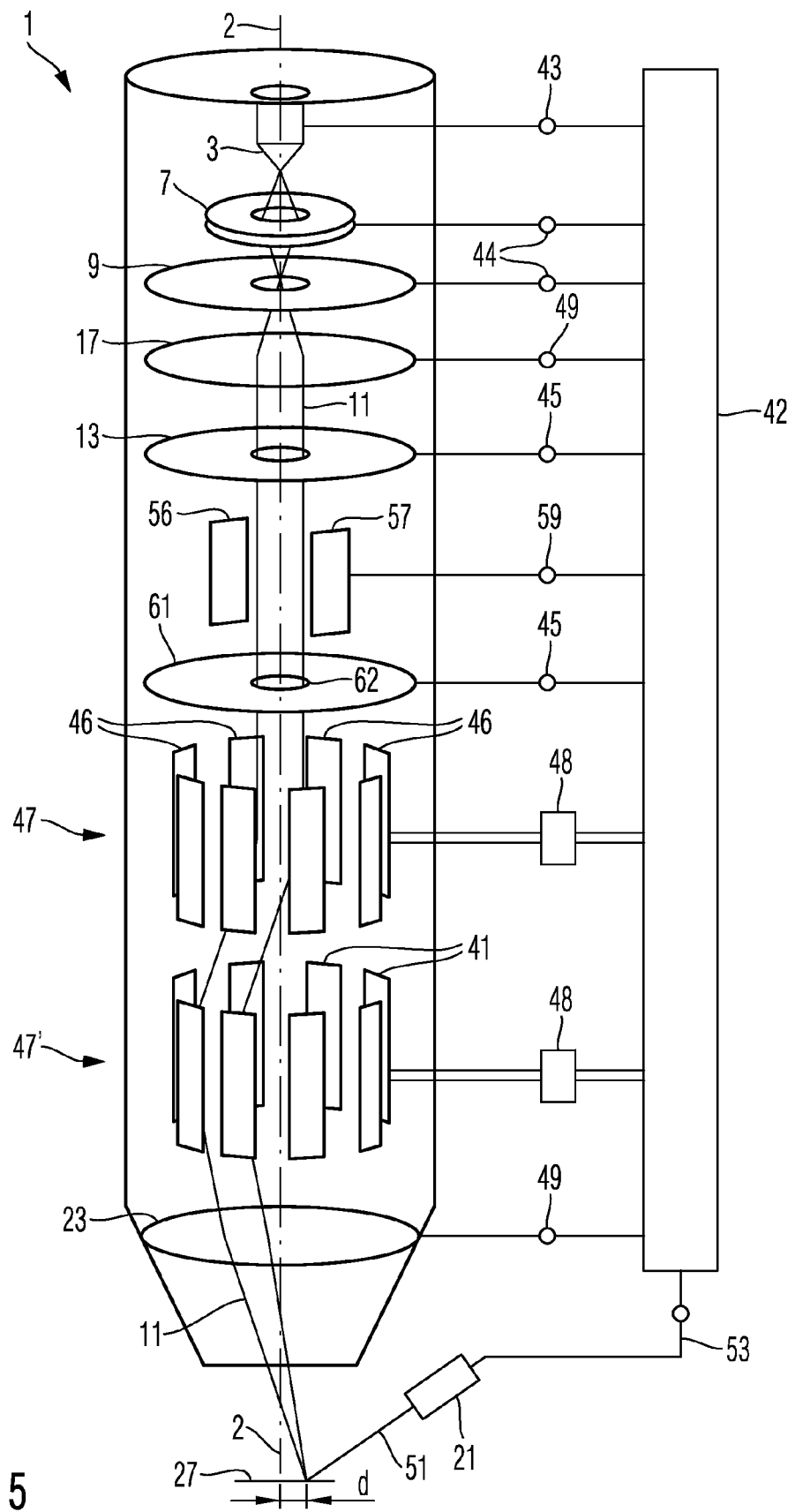
FIG. 5 is a schematic illustration of a charged particle beam system according to a further exemplary embodiment.

FIG. 5 is a schematic illustration of an embodiment of a particle beam system which is an ion beam system in the illustrated example. The ion beam system 1 includes an ion source 3 and electrodes 7 and 9 for extracting ions from the source 3 and accelerating the extracted ions to generate an ion beam 11 which is collimated by a condenser lens 17. The beam 11 is further accelerated by an electrode 13 and traverses a beam blanker 55 including deflector electrodes 56 and 57, and a plate 61 having an aperture 62 configured such that the beam 11 may traverse the aperture 62 when same electric potentials are applied to the electrodes 56 and 57 and such that the beam 11 is incident on and absorbed by the plate 61 if different electric potentials are applied to the electrodes 56 and 57.

An objective lens 23 configured to focus the ion beam 11 in an object plane 27 is provided downstream of the beam blanker 55.

The ion beam system 1 further includes a first beam deflector 47 arranged downstream of the beam blanker 55, and a second beam deflector 47' arranged downstream of the first beam deflector 47 and upstream of the objective lens 23. The beam deflectors 47 and 47' are configured to direct the ion beam 11 to selected locations within the object plane 27. In the illustration of FIG. 5, the ion beam 11 is focused in the object plane 27 at a distance d of an axis of symmetry 2 of the objective lens 23. To achieve such deflection of the ion beam 11, the first deflector 47 deflects the beam away from the axis of symmetry 2, and the subsequent second deflector 47' deflects the beam towards the axis of symmetry 2 such that the beam 11 traverses the objective lens 23 close to its axis of symmetry, such that aberrations introduced by the objective lens 23 are maintained at a relatively low level.

A secondary particle detector 21 is located close to the object plane 27 such that secondary particles generated by the incident ion beam 11 can be detected. A line 51 in FIG. 5 represents an exemplary trajectory of an electron released from an object and incident on the detector 21.

The ion beam system 1 includes a controller for controlling the individual components for generating and directing the ion beam 11 to the object plane 27. Similar to the illustration of FIG. 1, the controller 42 is shown as a functional block including plural control modules which can be physically separated from each other and/or are embodied as software modules running on a suitable processor. In particular, the ion source 3 is connected to the controller 42 via a connector 43 such that the controller 42 can energize and operate the ion source 3. The electrodes 7, 9, 13 and 61 are connected to the controller 42 via connectors 44 and 45 such that the electric potentials applied to the electrodes can be adjusted by the controller 42. Similarly, connectors 49 are provided to connect lenses 17 and 23 to the controller 42 such that the controller 42 can supply suitable electric potentials and currents to the lenses in order to collimate and focus the ion beam 11.

The first and second beam deflectors 47 and 47' each include a plural deflecting electrodes 46 distributed about the axis of symmetry 2. The number of deflecting electrodes 46 can be, for example, two, fours, eight, as in the illustrated embodiment, or even more than eight. The deflecting electrodes 46 are connected to the controller 42 via connectors 48 such that the controller 42 can adjust angles and orientations of deflections provided by the deflectors 47, 47' to the ion beam 11.

Similarly, the detector 21 is connected to the controller 42 via a connector 53 such that the controller can receive detection signals produced by the detector 21.

The controller 42 may have a configuration similar to that illustrated with reference to FIG. 3 above. In particular, the controller 42 may include an interface for receiving parameters of a task to be performed by the ion beam system 1, a calculation module configured to determine commands and command parameters suitable for controlling the beam blanker 55, the first and second deflectors 47, 47' and an acquisition of measurement data via detector 21. The controller 42 may further include a command generation module for encoding the calculated commands and command parameters into digital command data, and a network for distributing the digital command data to control modules controlling the components of the ion beam system 1, such as a beam blanking module, a beam deflection module for the first beam deflector 47, a beam deflection module for the second beam deflector 47' and a data acquisition module for acquiring the measurement data from the detector 21.

Figure 6:
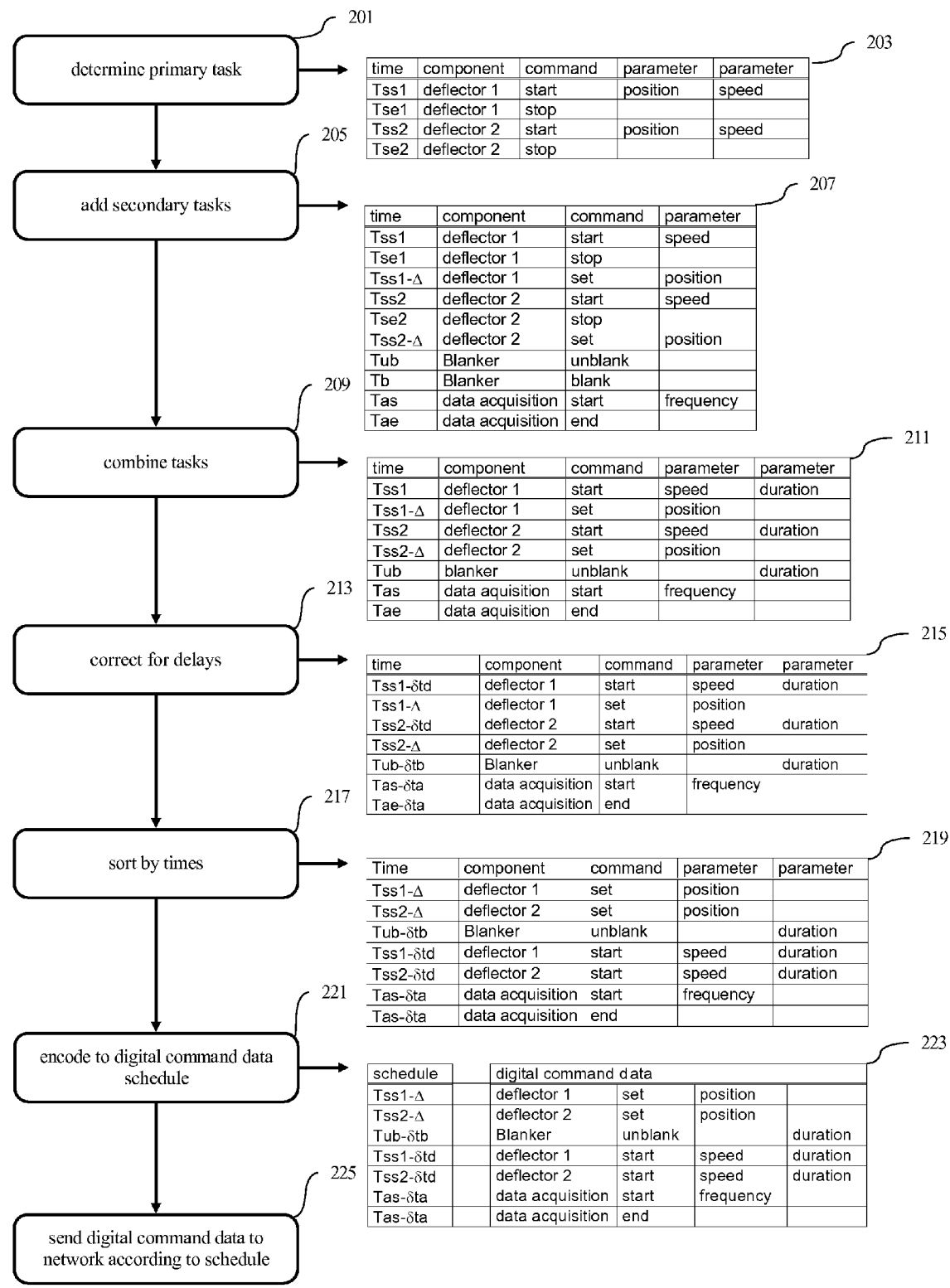
FIG. 6 is a flowchart illustrating a method of controlling the charged particle beam system shown in FIG. 5.

FIG. 6 is a flow diagram illustrating a method of controlling the various modules of the ion beam system 1.

In a step 201, parameters of a primary task are determined. In the illustrated example, the task is to scan the focused ion beam along a straight line on the sample and to record corresponding detection signals generated by the detector 21. The corresponding primary task is to control the first and second deflectors such that a voltage applied to opposite deflections electrodes 46 of the first deflector 47 starts to rise from a given voltage level (position) at a time Tss1 with a certain rate (speed), and stops rising a at a time Tse1. A corresponding procedure is defined for the second deflector 47', wherein the positions and speeds may vary between the deflectors since the second deflector 47' has to deflect the beam by a larger amount than the first deflector 47. Also the start times and end times will vary between the deflectors due to a traveling time of the ions between the first deflector 47 and the second deflector 47'. The parameters of the primary task can be entered by the user, or they can be generated by some software and supplied to the controller 42 via its interface. The parameters of the primary task can be represented by a data structure which is shown in FIG. 6 as a table 203, in which separate lines indicate separate commands for operating components and in which the columns represent the time when a given command is to be executed, a component performing the command, a command performed by the component and parameters of the respective command.

In a step 205, additional secondary tasks are determined which are used to perform the primary task. For example, in order to start deflection with deflector 1 using a given voltage level (position) at time Tss1, the initial voltage level (position) is set at an earlier time Tss1-Δ, wherein Δ is selected such that the voltage applied to the pair of electrodes 46 has settled and is sufficiently stable at time Tss1. A similar procedure is applied to the second deflector. Moreover, the beam blanker is controlled to un-blank the beam at a time Tub which is earlier than the start of the deflection by deflector 1 due to traveling times of the ions between the beam blanker and the first deflector. A time Tb for the beam blanker to blank the beam is also determined. Moreover, commands for starting the data acquisition at a time Tas and for terminating the data acquisition at a time Tae is determined. The time Tas will be later than the time Tss1 for starting the deflection with the first deflector due to traveling times of the ions towards the sample and of secondary particles from the sample towards the detector 21.

A data structure representing the commands after the secondary tasks have been added can be represented as a table 207, in which different lines represent different commands and columns represent times, components, commands and parameters.

The step 205 of adding secondary tasks can be performed by the calculation module of the controller 42.

Certain commands of the table 207 can be combined into combined commands in a step 209. For example, the commands of instructing the first deflector to start deflecting at Tss1 and to stop deflecting at Tse1 can be combined to a combined command which instructs the first deflector to start deflection at Tss1 wherein a duration of the deflection is a parameter of the command. Similarly, the commands for starting and stopping the deflection of the second deflector and the commands for un-blanking and blanking the beam can be combined into combined commands having a duration as a parameter. A data structure representing the combined commands can be represented as a table 211. The step 209 of combining tasks can also be performed by the calculation module of the controller 42.

In a step 213, some of the commands are corrected for delays by control modules and electronic components and circuits between receipt of the respective commands and start of execution of the commands. For example, the time Tss1 for starting the deflection with the first deflector is corrected by a delay δtd by the deflection module to receive and analyze the command and to set electronic circuits such as voltage generators in order to perform the deflection. The corrected time Tcss1=Tss1-δd indicates the command time at which the command is to be sent to the network such that the beam scanning starts at the time Tss1. Similarly, The command time Tcub for instructing the beam blanker to un-blank the beam at Tub is determined by subtracting a delay δtb from Tub, and the command times Tcas and Tcae of the commands instructing the data acquisition module to start and end data acquisition are determined by subtracting a delay δta from Tas and Tae, respectively. In the illustrated example, the times Tss1-Δ and Tss2-Δ are not corrected for additional electronic delays since the time Δ has been selected such that the initial voltages are set sufficiently ahead of the times Tss1 and Tss2, respectively. The command times of these commands for instructing the beam deflection module are equal to Tss1-Δ and Tss2-Δ, accordingly. A data structure representing the commands generated in step 213 is shown as a table 215 in FIG. 6. Also the step 213 can be performed by the calculation module of the controller 42.

The commands generated in step 213 are sorted by command time in a step 217 such that the commands are arranged according to their corresponding times. The sorted commands are shown as a table 219 in FIG. 6. Also the step 217 can be performed by the calculation module of the controller 42.

Thereafter, the commands are encoded into digital command data associated with a command schedule in a step 221. The digital command data of each command can be sent across the network to the receiving control modules of the controller 42. The digital command data and schedule are represented as a table 223 in FIG. 6. The encoding of the commands in step 221 can be performed by a command generating module of the controller 42 after having received the calculated commands from the calculation module.

The command generation module will then send the sequence of digital command data to the network at times defined by the schedule in a step 225. A start time of sending the sequence of commands can be defined by a trigger signal generated by a clock or supplied separately. The digital command data are received by the beam blanking module, the beam deflection modules and the data acquisition module from the network, and the modules interpret the commands and control the beam blanker, deflectors and data acquisition components such that the commands are executed as desired.

In the example illustrated with reference to FIG. 6 above, each digital command includes an instruction for one module of the charged particle system. According to other examples, the digital commands can be generated such that some or all digital commands each include instructions for more than one module, as illustrated with reference to FIG. 4b above.

In the examples illustrated above, the method of operating a particle beam system using sorted commands sent to a network such that they are received by a beam deflection module and a beam blanking module are used for performing a line scan with the charged particle beam. However, these methods can also be used to perform other procedures with the charged particle system, such as modifying a sample by deposition of material on or removal of material from a sample, which may be assisted by supplying a reactive gas to the sample, or writing a pattern into a resist. These procedures involve an operation of deflecting the beam to a target position on the sample and, when the beam has reached the target position, un-blanking of the beam such that a dose of charged particles is delivered to the surface of the sample in order to perform the action, such as removal of material, deposition of material and modifying a resist. Depending on a configuration of the pattern, initial deflections to deflect the beam such that it is directed to a target position within a particular pattern feature depends on a distance of this particular pattern feature from another pattern feature which was previously processed. For example, to move the beam from a previously processed pattern feature to a closely adjacent pattern feature involves a relatively small deflection, whereas moving the beam from a previously processed pattern feature to a distant next pattern feature will involve a substantially larger amount of deflection. Depending on the deflection amount, different settling times will be used after completion of the deflection until the beam is stable and points to the desired target location within the next feature. Generally, such settling times or additional waiting times are greater for greater deflections. In order to perform the desired action, such as writing a pattern, with a high accuracy, the beam is un-blanked only after such settling time has expired. With the methods illustrated above, such additional and variable waiting times can be easily achieved. According to an exemplary embodiment in this context, the beam un-blank time is later than the deflection stop time, and a time difference between the beam un-blank time and the deflection stop time is variable. For example, this time difference can be varied by more than 5 μs and 50 μs.

In the embodiments illustrated above, one particle beam column, such as an electron beam column shown in FIG. 1 and an ion beam column shown in FIG. 5 are controlled by using methods for generating digital commands for controlling modules of the particle beam column as illustrated above. However, it is also possible to control modules distributed across plural particle beam columns using such methods. For example, a system including an electron beam column and an ion beam column can be controlled with such methods, wherein various modules, such as deflectors, beam blankers and detectors, of the two particle beam columns are connected to a common data network. The modules of the two particle beams may receive digital commands generated based on sorted data records including commands representing instructions for the individual modules. The digital commands can be generated by one controller, for example.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method of operating a particle beam system, the method comprising:
   determining at least one deflection amount and at least one deflection time at which a first beam deflection module of the particle beam system connected to a data network of the particle beam system is to provide the at least one deflection to a charged particle beam corresponding to the at least one deflection amount;
   determining an un-blank time at which a beam blanking module of the particle beam system connected to the data network is to un-blank the beam;
   determining a blank time at which the beam blanking module connected to the data network is to blank the beam;
   generating a data structure comprising a plurality of data records, each data record comprising a command representing an instruction for at least one of the first beam deflection module and the beam blanking module, each data record further comprising a command time representing a time at which the instruction is to be sent to the data network;
   sorting the data records by command time;
   generating a set of digital commands based on the data structure, one digital command being generated for each one of the data records; and
   sending the set of digital commands to the network in an order corresponding to an order of the sorted records, wherein:
   at least one digital command of the set of digital commands represents an instruction for the first beam deflection module to deflect the beam corresponding to the at least one deflection amount;
   at least one digital command of the set of digital commands represents an instruction for the beam blanking module to un-blank the beam; and
   at least one digital command of the set of digital commands represents an instruction for the beam blanking module to blank the beam.

2. The method according to claim 1, wherein at least one digital command of the set of digital commands represents both an instruction for the first beam deflection module to deflect the beam corresponding to the deflection amount and an instruction for the beam blanking module to un-blank the beam.

3. The method according to claim 1, wherein at least one digital command of the set of digital commands represents both an instruction for the first beam deflection module to deflect the beam corresponding to the deflection amount and an instruction for the beam blanking module to blank the beam.

4. The method according to claim 1, comprising determining first and second deflection amounts and first and second deflection times, wherein at least one digital command of the set of digital commands represents a combined instruction for the first beam deflection module to deflect the beam corresponding to the first deflection amount and to subsequently provide a deflect the beam corresponding to the second deflection amount.

5. The method according to claim 4, wherein the at least one digital command comprises at least one data element representing a time difference between the second and first deflection times.

6. The method according to claim 4, wherein the at least one digital command comprises at least one data element representing at least one of: a) a deflection step size by which the first beam deflection module is to change the deflection of the beam in subsequent time steps; and b) a number of steps in which the first beam deflection module is to change the deflection of the beam between the first deflection time and the second deflection time.

7. The method according to claim 1, wherein the un-blank time is later than the deflection time, and a time difference between the beam un-blank time and the deflection time is variable.

8. The method according to claim 7, wherein the time difference between the un-blank time and the deflection time can be varied by more than 5 microseconds.

9. The method according to claim 1, wherein:
the data structure comprises a first data record comprising a command representing an instruction for the beam blanking module to un-blank the beam and a first command time representing a time at which this instruction is to be sent to the data network;
the data structure comprises a second data record comprising a command representing an instruction for the beam blanking module to blank the beam and a second command time representing a time at which this instruction is to be sent to the data network; and
a time difference between the blank and un-blank times differs from a time difference between the second and first command times.

10. The method according to claim 9, wherein the time difference between the blank and un-blank times differs from the time difference between the second and first command times by more than 50 nanoseconds.

11. The method according to claim 1, wherein:
the data structure comprises at least one record comprising a command representing both an instruction for the beam blanking module to un-blank the beam and an instruction for the beam blanking module to blank the beam; and
the at least one command comprises at least one data element representing a time difference between the blank and un-blank times.

12. The method according to claim 1, further comprising:
determining a data acquisition start time at which a data acquisition module of the particle beam system connected to the data network is to start collecting data representing detected particle intensities; and
determining a data acquisition stop time at which the data acquisition module is to stop collecting data,
wherein:
at least one digital command of the set of digital commands represents an instruction for the data acquisition module to start collecting of the data; and
at least one digital command of the set of digital commands represents an instruction for the data acquisition module to stop collecting of the data.

13. The method according to claim 12, wherein at least one digital command of the set of digital commands represents a combined instruction for the first data acquisition module to start collecting the data and to subsequently stop collecting the data.

14. The method according to claim 13, wherein the at least one digital command comprises at least one data element representing a time difference between the acquisition stop time and the acquisition start time.

15. The method according to claim 1, further comprising determining at least one deflection amount and at least one deflection time at which a second beam deflection module of the particle beam system connected to a data network of the particle beam system is to provide a deflection to a charged particle beam corresponding to the deflection amount, wherein at least one digital command of the set of digital commands represents an instruction for the second beam deflection module to provide the deflection to the beam corresponding to the deflection amount.

16. The method according to claim 1, wherein at least one parameter is greater than one nanosecond, the at least one parameter being selected from the group consisting of:
a time difference between: a) the command time of the data record comprising the command representing the instruction for the first beam deflection module to provide the deflection to the charged particle beam corresponding to the deflection amount; and b) the deflection time;
a time difference between: a) the command time of the data record including the command representing the instruction for the beam blanking module to un-blank the beam; and b) the un-blank time; and
a time difference between: a) the command time of the data record including the command representing the instruction for the beam blanking module to blank the beam; and b) the blank time.

* * * * *

UNITED STATES PATENT AND TRADEMARK OFFICE
CERTIFICATE OF CORRECTION

| | |
|---|---|
| PATENT NO. | : 8,723,136 B2 |
| APPLICATION NO. | : 13/626736 |
| DATED | : May 13, 2014 |
| INVENTOR(S) | : Josef Biberger, Ralph Pulwey and Volker Wieczorek |

It is certified that error appears in the above-identified patent and that said Letters Patent is hereby corrected as shown below:

In the Specification

Col. 11, line 40, after "rising" delete "a".

Signed and Sealed this
First Day of July, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,723,136 B2 | Page 1 of 1 |
| APPLICATION NO. | : 13/626736 | |
| DATED | : May 13, 2014 | |
| INVENTOR(S) | : Josef Biberger, Ralph Pulwey and Volker Wieczorek | |

It is certified that error appears in the above-identified patent and that said Letters Patent is hereby corrected as shown below:

In the Claims

Column 15, line 5 (Claim 4, line 4) delete "provide a".

Signed and Sealed this
Twenty-second Day of July, 2014

Michelle K. Lee
*Deputy Director of the United States Patent and Trademark Office*